United States Patent
Burr

(10) Patent No.: US 6,501,295 B1
(45) Date of Patent: Dec. 31, 2002

(54) OVERDRIVEN PASS TRANSISTORS

(75) Inventor: James B. Burr, Foster City, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/872,840

(22) Filed: Jun. 1, 2001

(51) Int. Cl.⁷ .............................................. H01L 25/00
(52) U.S. Cl. ........................... 326/38; 326/41; 326/113
(58) Field of Search .............................. 326/38–41, 113

(56) References Cited

U.S. PATENT DOCUMENTS

| | | | |
|---|---|---|---|
| 4,365,172 A | 12/1982 | Prater | 307/270 |
| 4,700,212 A | 10/1987 | Okazawa | 357/41 |
| 5,362,981 A | 11/1994 | Sato et al. | 257/371 |
| 5,471,421 A | 11/1995 | Rose et al. | 365/182 |
| 5,566,120 A | 10/1996 | D'Souza | 365/227 |
| 5,581,500 A | 12/1996 | D'Souza | 365/154 |
| 5,594,371 A | 1/1997 | Douseki | 326/119 |
| 5,598,114 A * | 1/1997 | Jamshidi | 326/113 |
| 5,606,270 A | 2/1997 | D'Souza et al. | 326/98 |
| 5,612,645 A | 3/1997 | Halepete | 327/537 |
| 5,622,880 A | 4/1997 | Burr et al. | 438/194 |
| 5,640,115 A | 6/1997 | Halepete et al. | 327/219 |
| 5,650,340 A | 7/1997 | Burr et al. | 437/30 |
| 5,675,172 A | 10/1997 | Miyamoto et al. | 257/402 |
| 5,719,422 A | 2/1998 | Burr et al. | 257/336 |
| 5,726,477 A | 3/1998 | Williams et al. | 257/402 |
| 5,751,170 A | 5/1998 | Pyeon | 327/57 |
| 5,753,958 A | 5/1998 | Burr et al. | 257/392 |
| 5,760,607 A * | 6/1998 | Leeds et al. | 326/38 |
| 5,773,863 A | 6/1998 | Burr et al. | 257/344 |
| 5,780,912 A | 7/1998 | Burr et al. | 257/408 |
| 5,783,958 A | 7/1998 | Lysinger | 327/202 |
| 5,811,871 A | 9/1998 | Nakashima | 257/565 |
| 5,916,237 A | 6/1999 | Schu | 607/2 |
| 5,923,987 A | 7/1999 | Burr | 438/304 |
| 5,942,781 A | 8/1999 | Burr et al. | 257/347 |
| 5,982,211 A | 11/1999 | Ko | 327/202 |
| 5,985,705 A | 11/1999 | Seliskar | 438/197 |
| 5,985,727 A | 11/1999 | Burr | 438/302 |
| 5,998,850 A | 12/1999 | Burr | 257/428 |
| 6,031,778 A | 2/2000 | Makino et al. | 365/226 |
| 6,048,746 A | 4/2000 | Burr | 438/17 |
| 6,072,217 A | 6/2000 | Burr | 257/351 |
| 6,087,892 A | 7/2000 | Burr | 327/534 |
| 6,091,283 A | 7/2000 | Murgula et al. | 327/537 |
| 6,093,951 A | 7/2000 | Burr | 257/408 |
| 6,100,567 A | 8/2000 | Burr | 257/365 |
| 6,110,783 A | 8/2000 | Burr | 438/286 |
| 6,118,328 A | 9/2000 | Morikawa | 327/534 |
| 6,121,666 A | 9/2000 | Burr | 257/408 |
| 6,130,550 A | 10/2000 | Zaliznyak | 326/39 |
| 6,133,762 A | 10/2000 | Hill et al. | 326/119 |
| 6,137,142 A | 10/2000 | Burr | 257/349 |
| 6,144,079 A | 11/2000 | Shirahata et al. | 257/392 |
| 6,157,213 A * | 12/2000 | Voogel | 326/41 |
| 6,190,954 B1 | 2/2001 | Lee et al. | 438/199 |
| 6,211,725 B1 | 4/2001 | Kang | 327/534 |
| 6,231,147 B1 | 5/2001 | Bosshart | 327/212 |
| 6,255,853 B1 | 7/2001 | Houston | 326/98 |
| 6,310,487 B1 | 10/2001 | Yokomizo | 324/769 |
| 6,329,874 B1 | 12/2001 | Ye et al. | 327/544 |
| 6,337,583 B1 | 1/2002 | Ooishi et al. | 326/119 |

\* cited by examiner

*Primary Examiner*—Michael Tokar
*Assistant Examiner*—Vibol Tan
(74) *Attorney, Agent, or Firm*—Gunnison, McKay & Hodgson, L.L.P.; Philip J. McKay

(57) ABSTRACT

Programmable logic structures include logic blocks that operate at very low supply voltages. According to the invention, a pass transistor is positioned between logic blocks. Since the logic blocks of the invention operate at very low supply voltages, the pass transistor can be overdriven on, thereby reducing the added resistance. In one embodiment of the invention, the pass transistor is a low threshold transistor. In this embodiment, the pass transistor is also overdriven off to reduce leakage current and further isolate the logic blocks.

21 Claims, 4 Drawing Sheets

OVERDRIVEN PASS TRANSISTORS

FIELD OF THE INVENTION

The present invention relates generally to transistor devices and, more particularly, to pass transistor structures and methods.

BACKGROUND OF THE INVENTION

An important capability in modern electronic systems is the capability for making programmable interconnections between logic components or logic blocks. This capability is provided by components such as Field Programmable Gate Arrays (FPGAs) and other programmable interconnect logic and circuits. Consequently, it is important to find methods to improve performance of these devices, reduce their power consumption and simplify their structures and design.

FIG. 1 is a schematic representation of a typical prior art structure 100 that included: prior art logic block 101; prior art logic block 103; and prior art transmission gate 105, coupled between prior art logic block 101 and prior art logic block 103. As shown in FIG. 1, prior art logic block 101 included input node 111 and output node 113. Like prior art logic block 101, prior art logic block 103 also included an input node 119 and output node 121. Prior art logic blocks 101 and 103 typically comprised any one of numerous devices well known to those of skill in the art such as single transistors, inverters, latches, any one of several gates, or any other logic or memory devices. Both prior art logic blocks 101 and 103 were provided with prior art first supply voltage 131 and prior art second supply voltage 133. Since prior art logic blocks 101 and 103 were typically standard CMOS, the prior art supply voltage was typically on the order of two volts or more. Consequently, prior art first supply voltage 131 was typically 2.0 volts and prior art second supply voltage 133 was typically ground.

As seen in FIG. 1, prior art structure 100 also included prior art transmission gate 105 for selectively, and programmably, connecting prior art logic blocks 101 and 103. Prior art transmission gate 105 included first node 115, coupled to output node 113 of prior art logic gate 101, and second node 117, coupled to input node 119 of prior art logic block 103. Prior art transmission gate 105 also included: prior art NFET 107 with gate 107G and prior art PFET 109 with gate 109G. Prior art NFET 107 and prior art PFET 109 were typically coupled together as shown in FIG. 1, to allow transmission of both digital one and digital zero values as discussed in more detail below.

Prior art transmission gate 105 had three significant drawbacks. First, the addition of prior art transmission gate 105 added significant resistance to the path between output node 113 of prior art logic block 101 and input node 119 of prior art logic block 103, i.e., prior art transistors 107 and 109 each added a resistance in series to the path between prior art logic block 101 and prior art logic block 103. Second, prior art transmission gate 105 was a relatively complex structure requiring the use of at least two transistors, 107 and 109. Third, prior art transmission gate 105 added significant parasitic capacitance to the path between output node 113 of prior art logic block 101 and input node 119 of prior art logic block 103. The added resistance and parasitic capacitance meant decreased performance of prior art structure 100 and increased power dissipation. The performance reduction due to the addition of prior art transmission gate 105, and prior art transistors 107 and 109, could be partially offset in the prior art by increasing the size of prior art transistors 107 and 109 relative to the size of the transistors making up logic blocks 101 and 103 (not shown). However, even a ten fold increase in relative size of prior art transistors 107 and 109, compared to the transistors in logic blocks 101 and 103, would still typically yield a decrease in performance of more than ten percent. This was still a very significant performance loss.

A theoretical way to minimize the decrease in performance of prior art structure 100 due to the addition of prior art transistors 107 and 109 would be to drive prior art transistors 107 and 109 at a higher voltage than the voltage driving logic blocks 101 and 103. However, in practice, to actually make any significant difference in the performance, i.e., to significantly decrease the resistance added by prior art transistors 107 and 109, the supply voltages of prior art gating transistors 107 and 109 would need to be multiples, and preferably an order of magnitude, larger than the differential between first supply voltage 131 and second supply voltage 133. However, as noted above, in standard CMOS, the voltage differential between first supply voltage 131 and second supply voltage 133 is on the order of two volts. Standard transistors typically cannot tolerate more than about 2.5 volts in 0.25 micron technology with 50 angstroms of gate oxide, consequently, the voltage differential required to significantly decrease the added resistance of prior art transistors 107 and 109 could not be withstood by standard CMOS transistors, over time, and prior art transistors 107 and 109 would eventually break down.

The relative complexity of prior art transmission gate 105, i.e., the need for two prior art transistors 107 and 109, arose from the relatively high threshold voltages of prior art transistors 107 and 109 and from the well known body effect. As a result, NFETs, such as prior art transistor 107, could pass a digital zero relatively well but could not pass a digital one efficiently. On the other hand, PFETs, such as prior art transistor 109 could pass a digital one relatively well but could not pass a digital zero well. Consequently, in prior art transmission gates, such as prior art transmission gate 105, an NFET, such as prior art transistor 107, was included to pass digital zeros while a PFET, such as prior art transistor 109 was included in transmission gate 105 to pass digital ones. This coupling of NFETs and PFETs performed reasonably well in prior art transmission gates 105. However, the use of two transistors 107 and 109 meant increased parasitic capacitance, increased area, and increased circuit complexity, with more elements to potentially fail.

What is needed is a method and apparatus for providing a transmission gate function between two logic blocks that is more efficient, in terms of lowering added resistance, lowering added parasitic capacitance and in terms of circuit complexity and size.

SUMMARY OF THE INVENTION

According to one embodiment of the invention, low voltage programmable logic structures are provided that include low voltage logic blocks comprised of low threshold transistors. The low voltage logic blocks are provided with low supply voltages. According to one embodiment of the invention, the low voltage logic blocks are separated by pass transistors. Since the logic blocks of the invention are low voltage, the pass transistors of the invention can be overdriven on, i.e., provided gate to source voltages (Vgs) significantly larger than the programmable logic structure's supply voltage, without causing the destruction of the pass transistor. For instance, in one embodiment of the invention, the programmable logic structure's supply voltage is 200 millivolts while the gate to source voltage ($V_{gs}$) of the pass transistor, when the transistor is overdriven on, is on the order of 2.0 volts. This is in direct contrast to prior art transmission gates that had to be driven at essentially the same $V_{gs}$ as the supply voltage to avoid transistor breakdown. By overdriving the pass transistors of the invention, the resistance added to the structure by the pass transistors, i.e., the resistance added by coupling the pass transistor between logic blocks is decreased significantly without resorting to increasing the size of the pass transistors.

In addition, if even less resistance is desired, the size of the pass transistors of the invention can be increased and the pass transistors can still be overdriven according to the invention. Consequently, using the invention, there is an approach for resistance reduction available that was not available in the prior art and can provide orders of magnitude decrease in the added resistance along with a decrease in added parasitic capacitance. Therefore, the invention can provide the advantages of a programmable interconnection without the large performance penalty associated with the prior art.

In addition, if even less resistance is desired, according to the invention, the pass transistors can be low threshold transistors. In this embodiment the low threshold pass transistors are overdriven on to reduce resistance as described in detail below and overdriven off to reduce leakage current and further isolate the logic blocks.

In addition, as discussed in more detail below, since the pass transistors of the invention are overdriven on, a single NFET can pass a digital zero or a digital one efficiently, or a single PFET can pass a digital one or digital zero efficiently. This situation is further improved when the pass transistors are low threshold pass transistors. Consequently, using the method and structure of the invention, a single pass transistor can be used as opposed to the two transistor structure of the transmission gates of the prior art. Consequently, a programmable logic structure designed according to the principles of the method and the structure of this embodiment of the invention has better performance, reduced parasitic capacitance, is simpler and less expensive to implement than prior art structures.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

Figure 1:
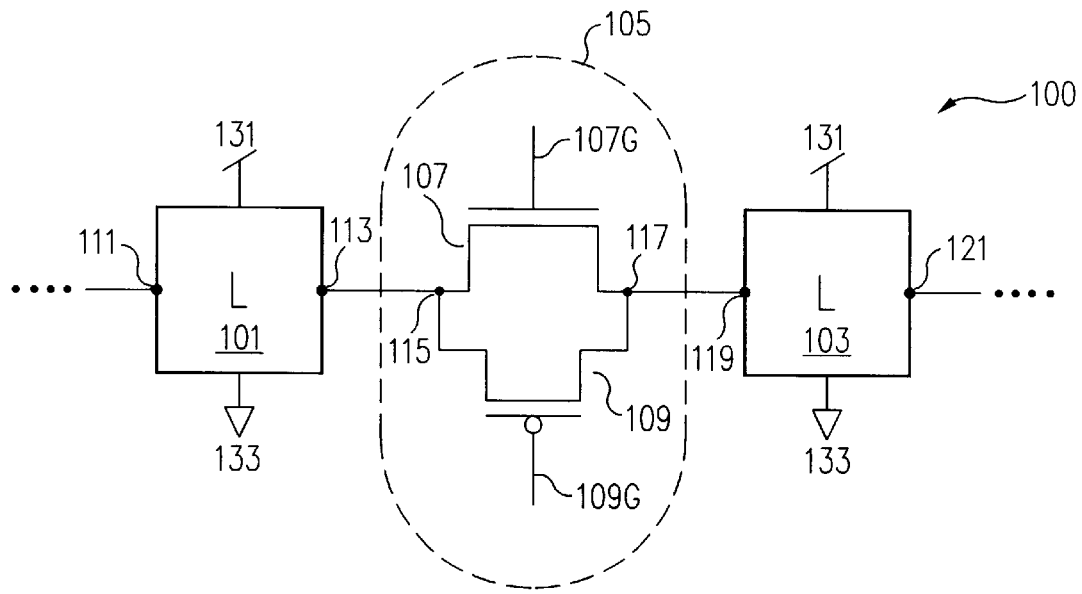
FIG. 1 is a schematic representation of a typical prior art structure that included: a first prior art logic block; a second prior art logic block; and a prior art transmission gate.

The invention will now be described in reference to the accompanying drawings. The same or similar reference numbers may be used throughout the drawings and the following description to refer to the same or like parts.

According to one embodiment of the invention, low voltage programmable logic structures (200 in FIG. 2A and 200B in FIG. 2B) are provided that include low voltage logic blocks (201 and 203 in FIG. 2A and 251 and 253 in FIG. 2B) comprised of low threshold transistors (not shown). The low voltage logic blocks are provided with low supply voltages (231 and 233 in FIG. 2A and 281 and 283 in FIG. 2B). According to one embodiment of the invention, the low voltage logic blocks are separated by pass transistors (207 in FIG. 2A and 257 and 259 in FIG. 2B). Since the supply voltages of the logic blocks of the invention are low, the pass transistors of the invention can be overdriven on and provided gate to source voltages ($V_{gs}$) significantly larger than the programmable logic structure's supply voltage, i.e., the supply voltage to the logic blocks and the source and drain of the pass transistor, without causing the destruction of the pass transistor. For instance, in one embodiment of the invention, the programmable logic structure's supply voltage is 200 millivolts while the $V_{gs}$ of the pass transistor, when the pass transistor is overdriven on, is on the order of 2.0 volts. This is in direct contrast to prior art transmission gates that had to be driven at essentially the same $V_{gs}$ as the supply voltage to avoid transistor breakdown. By overdriving the pass transistors of the invention, the resistance added to the structure by the pass transistors, i.e., the resistance added by coupling the pass transistor between logic blocks, is decreased significantly without resorting to increasing the size of the pass transistors.

In addition, if even less resistance is desired, the size of the pass transistors of the invention can be increased and the pass transistors can still be overdriven according to the invention. Consequently, using the invention, there is an approach for resistance reduction available that was not available in the prior art and can provide orders of magnitude decrease in the added resistance. Therefore, the invention can provide the advantages of a programmable interconnection without the large performance penalty associated with the prior art.

In addition, as discussed in more detail below, since the pass transistors of the invention are overdriven on, a single NFET (207 in FIG. 2A) can pass a digital zero or a digital one efficiently, or a single PFET can pass a digital one or digital zero efficiently. This situation is further improved when the pass transistors are low threshold pass transistors. Consequently, using the method and structure of the invention, a single pass transistor can be used as opposed to the two transistor structure of the transmission gates of the prior art. Consequently, a programmable logic structure designed according to the principles of the method and the structure of this embodiment of the invention has better performance, reduced parasitic capacitance, is simpler and less expensive to implement than prior art structures.

In the discussion that follows, an NFET may be used as a particular example. However, those of skill in the art will readily recognize that a PFET will behave in essentially the same manner with reversed polarities. Both types of transistors have advantages and disadvantages and, to a large extent, the choice of either a PFET or an NFET is application dependent. An NFET is therefore chosen in the discussion below for simplicity and to avoid detracting from the invention.

Figure 2A:
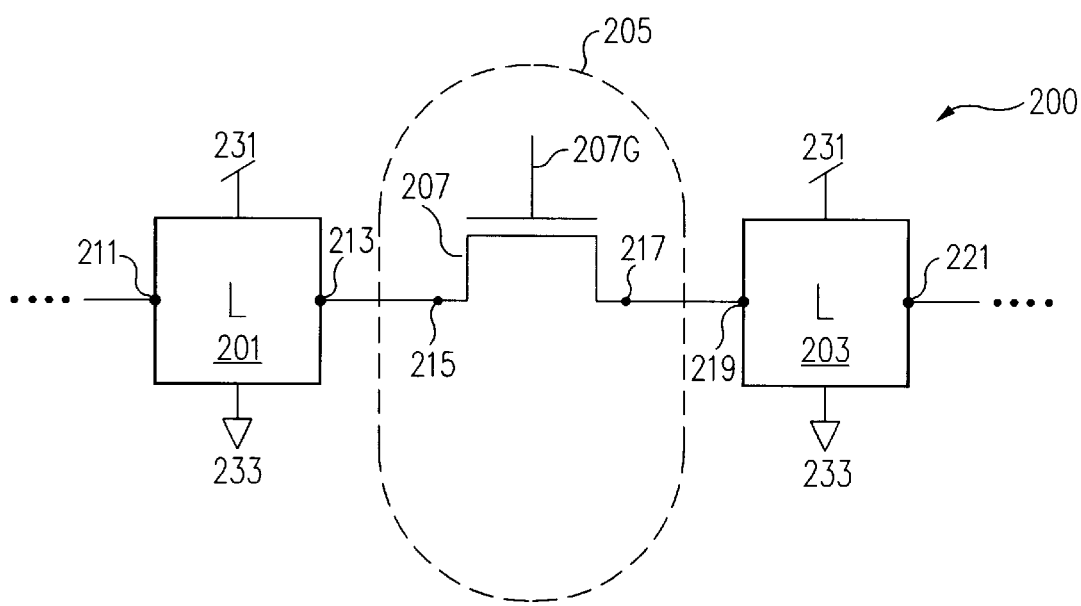
FIG. 2A shows a programmable logic structure including a single pass transistor in accordance with the principles of one embodiment of the invention.

FIG. 2A shows a programmable logic structure 200 according to one embodiment of the invention. According to the invention, programmable logic structure 200 includes: first logic block 201; second logic block 203; and transmission structure 205, coupled between first logic block 201 and second logic block 203. As shown in FIG. 2, first logic block 201 includes input node 211 and output node 213. Like first logic block 201, second logic block 203 also includes an input node 219 and an output node 221. Logic blocks 201 and 203 typically comprise any one of numerous devices well known to those of skill in the art such as single transistors, inverters, latches, any one of several gates, or any other logic or memory devices. According to the invention, regardless of the particular types of devices included in logic blocks 201 and 203, the devices in logic blocks 201 and 203 are low voltage devices comprised of low threshold transistors (not shown) with unbiased threshold voltages of less than 300 millivolts.

For a detailed discussion of low voltage and low threshold transistors and devices, see the list of related Patents below, all issued in the name of the present inventor and assigned to assignee of the present invention, that are incorporated herein, in their entirety, by reference.

First and second logic blocks 201 and 203 each include first supply voltage 231 and second supply voltage 233. Since, according to the invention, logic blocks 201 and 203 are comprised of low threshold transistors, logic blocks 201 and 203 are provided with very low supply voltages, typically less than 400 millivolts and, in one embodiment, the supply voltage is 200 millivolts or less. Consequently, in one embodiment of the invention, first supply voltage 231 is typically 200 millivolts and second supply voltage 233 is ground.

As seen in FIG. 2, according to the invention, programmable logic structure 200 also includes transmission unit 205 for selectively, and programmably, connecting logic blocks 201 and 203. Transmission unit 205 performs the same function as transmission gate 105 of FIG. 1, discussed above. Transmission unit 205 includes first node 215, coupled to output node 213 of first logic gate 201, and second node 217, coupled to input node 219 of second logic block 203. According to the invention, and in contrast to the prior art, transmission unit 205 includes only a single pass transistor 207 having a gate 207G.

Recall that prior art transmission gate 105 included both prior art NFET 107 and prior art PFET 109, coupled as shown in FIG. 1. Further recall, that this dual transistor structure was necessitated by the fact that NFET 107 and PFET 109 were standard CMOS transistors and therefore operated at standard supply voltages and could not be overdriven at voltages significantly greater than the prior art supply voltages. In addition, high threshold voltages and significant body effect further degraded the ability of prior art NFET 107 to pass digital ones and PFET 109 to pass digital zeros. Therefore, both prior art transistors 107 and 109 were required for efficient transmission of both digital one and digital zero values.

According to the invention, logic blocks 201 and 203 are comprised of low threshold transistors and logic blocks 201 and 203 are provided with very low supply voltages, typically less than 400 millivolts. Therefore, pass transistor 207 can be overdriven on with relatively standard voltages, such as 2.0 volts, and consequently pass transistor 207 can be overdriven on without fear of harming pass transistor 207. For instance, in one embodiment of the invention, programmable logic structure 200's first supply voltage 231 is 200 millivolts while the $V_{gs}$ of pass transistor 207, when pass transistor 207 is overdriven on, is made on the order of 2.0 volts. According to the invention, this is done by providing a separate supply voltage to gate 207G of around 2.0 volts. This is in direct contrast to prior art transmission gates that had to be driven at essentially the same $V_{gs}$ as the supply voltage to avoid transistor breakdown.

Since, according to the invention, pass transistor 207 can, and is, overdriven on, pass transistor 207 can pass a digital one as well as a digital zero. Therefore, using the method and structure of the invention, a single pass transistor 207 takes the place of two prior art transistors 107 and 109. As a result, the programmable logic structure 200 of this embodiment of the invention is simpler, contributes less parasitic capacitance, and requires less silicon area than prior art structures. Also, according to the invention, there are less components and therefore less components to potentially fail.

In addition, in one embodiment of the invention, pass transistor 207 is a low threshold transistor having an unbiased threshold voltage of less than 300 millivolts. Consequently, pass transistor 207 exhibits reduced body effect and therefore passes a digital one as well as a digital zero even more efficiently. Also, in embodiments where pass transistor 207 is a low threshold pass transistor, the resistance of pass transistor 207 at a given gate voltage is further reduced. Therefore, these embodiments represent an even greater improvement over prior art structures.

By overdriving pass transistor 207 of the invention, the resistance added to the programmable logic structure 200 by pass transistor 207, i.e., the resistance added by coupling pass transistor 207 between first and second logic blocks 201 and 203, is decreased significantly without resorting to increasing the size of the pass transistors. This is because the effective resistance ($R_{eff}$) of a pass transistor is proportional to the ratio of the voltage between the drain and the source ($V_{ds}$) of the transistor to the voltage between the gate and the source ($V_{gs}$) of the transistor. Where $R_0$ is a constant representing the effective resistance of a transistor when $V_{ds}=V_{gs}$, this fact is represented by the relationship:

$$R_{eff}=R_0(V_{ds}/V_{gs}) \qquad \text{Relationship 1:}$$

As discussed above, in the prior art, transistors 107 and 109 were standard CMOS transistors and the gate voltages ($V_{gs}$) driving prior art transistors 107 and 109 was approximately the same as the supply voltage ($V_{ds}$). Consequently, $V_{ds}$ was approximately equal to $V_{gs}$ when prior art transistors 107 and 109 were "on". As a result, the ratio $V_{ds}/V_{gs}$ was approximately unity and the effective resistance of prior art transistors 107 and 109 was approximately equal to the constant $R_0$, i.e., $$R_{eff107}=R_0 \qquad \text{Relationship 2:}$$

According to the invention, pass transistor 207 is overdriven on at a voltage significantly greater than the supply voltage, consequently, Relationship 1 becomes:

$$R_{eff207}=R_0(V_{ds207}/V_{gs207}) \qquad \text{Relationship 3:}$$

As shown in FIG. 2, $V_{ds}$ is, at most, first supply voltage 231 minus second supply voltage 233 ($V_{supp}$) and $V_{gs}$ is the voltage supplied to the gate ($V_{gate}$). Consequently, the effective resistance of pass transistor 207, according to the invention is given by:

$$R_{eff207} = R_0(V_{supp})/(V_{gate}) \qquad \text{Relationship 4}$$

As discussed above, in one embodiment of the invention, $V_{supp}$ is 200 millivolts, or less, and $V_{gate}$ is typically 2.0 volts. In this embodiment of the invention, Relationship 4 becomes:

$$R_{eff207} = R_0(0.2)/(2) = R_0/10 \qquad \text{Relationship 5:}$$

Consequently, by overdriving pass transistor 207, according to this embodiment of the invention, the resistance added by pass transistor 207 is one tenth that added by prior art transmission gate 105.

In addition, if even less resistance is desired, the size of pass transistor 207 of the invention can be increased and pass transistor 207 can still be overdriven according to the invention. Consequently, using the invention, there is an approach for resistance reduction available that was not available in the prior art and can provide orders of magnitude decrease in the added resistance. Therefore, the invention can provide the advantages of a programmable interconnection without the large performance penalty associated with the prior art methods and structures.

In FIG. 2A, a programmable logic structure 200 is shown that includes a pass transistor 207 that is an NFET. However, those of skill in the art will readily recognize that this particular embodiment is shown only as an illustrative example and that, with minor modifications, such as reversing the polarity of the voltage supplied to gate 207G, programmable logic structure 200 could include a pass transistor 207 that is a PFET. Consequently, the particular embodiment discussed in FIG. 2A is chosen only to simplify the above discussion and avoid detracting from the invention by addressing multiple possible embodiments at one time.

As discussed above, prior art transmission gate 105 had three significant drawbacks. First, the addition of prior art transmission gate 105 added significant resistance to the path between output node 113 of prior art logic block 101 and input node 119 of prior art logic block 103. Second, prior art transmission gate 105 was a relatively complex structure requiring the use of at least two transistors, 107 and 109. Third, prior art transmission gate 105 added significant parasitic capacitance to the path between output node 113 of prior art logic block 101 and input node 119 of prior art logic block 103. This added resistance and parasitic capacitance meant decreased performance of prior art structure 100 and increased power dissipation.

As also discussed above, all three of these drawbacks of prior art transmission gate 105 are overcome, or reduced, by using the method and structure of the present invention including a transmission unit 205, including a single overdriven pass transistor 207, and by providing low voltage logic blocks 201 and 203.

In particular, programmable logic structures of the invention include low voltage logic blocks comprising low threshold transistors and therefore programmable logic structures of the invention can operate at very low supply voltages. Consequently, pass transistors of the invention can, and are, overdriven on. By overdriving pass transistors of the invention on, the resistance added by the pass transistors is significantly reduced.

In addition, since the pass transistors of the invention are overdriven on, the pass transistors pass both digital ones and digital zeros efficiently. Consequently, a single pass transistor can be used. By using a single pass transistor, the structure is simplified, the parasitic capacitance is reduced, and the number of transmission transistors used with the invention is typically half the number used in prior art structures. In addition, according to the invention, the pass transistors can be low threshold pass transistors. In this embodiment, resistance is further reduced and the ability to pass digital ones and digital zeros is further enhanced. In this event, it is desirable to overdrive the low threshold pass transistors of the invention off to control leakage current and more effectively isolate the logic blocks.

Figure 2B:
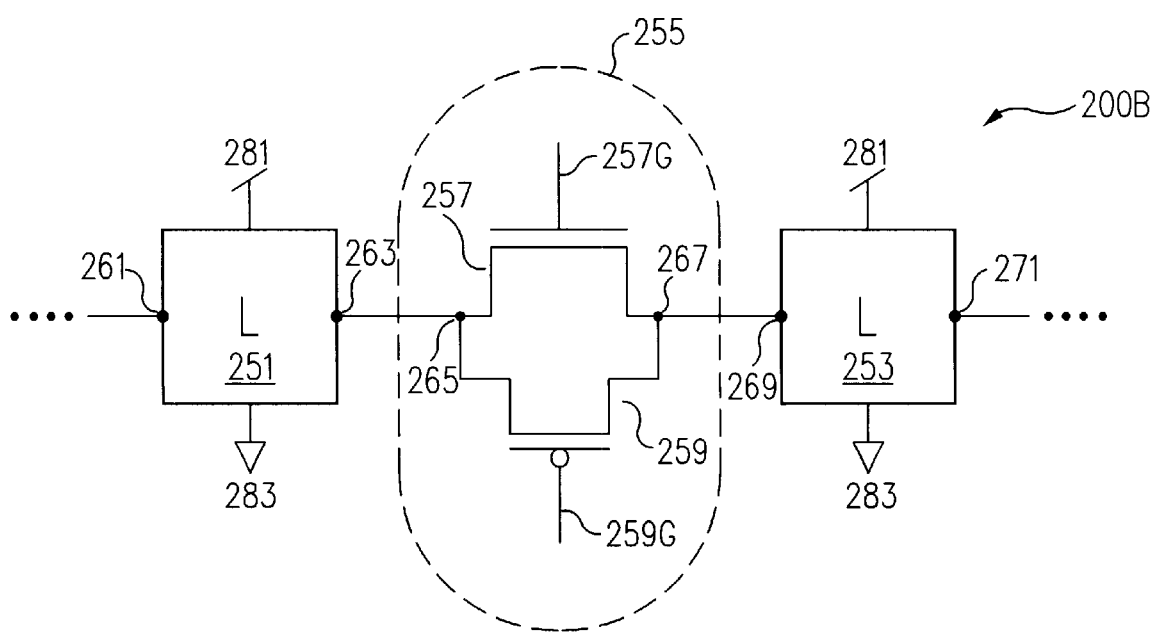
FIG. 2B shows a programmable logic structure including two pass transistors in accordance with the principles of one embodiment of the invention.

FIG. 2B shows another embodiment 200B of the invention using a transmission unit including transistors 257 and 259 coupled to form a transmission gate 255. Programmable logic structure 200B includes: first logic block 251; second logic block 253; and transmission gate 255, coupled between first logic block 251 and second logic block 253. As shown in FIG. 2B, first logic block 251 includes input node 261 and output node 263. Like first logic block 251, second logic block 253 also includes an input node 269 and output node 271. Logic blocks 251 and 253 typically comprise any one of numerous devices well known to those of skill in the art such as single transistors, inverters, latches, any one of several gates, or any other logic or memory devices.

First and second logic blocks 251 and 253 each include first supply voltage 281 and second supply voltage 283. Since, according to the invention, logic blocks 251 and 253 are comprised of low threshold transistors, logic blocks 251 and 253 are provided with very low supply voltages, typically less than 400 millivolts and, in one embodiment, the supply voltage is 200 millivolts. Consequently, in one embodiment of the invention, first supply voltage 281 is typically 200 millivolts and second supply voltage 283 is ground.

As seen in FIG. 2B, programmable logic structure 200B also includes transmission gate 255 for selectively, and programmably, connecting logic blocks 251 and 253. Transmission gate 255 includes first node 265, coupled to output node 263 of logic block 251, and second node 267, coupled to input node 269 of logic block 253. Transmission gate 255 also includes: NFET 257 with gate 257G and PFET 259 with gate 259G.

As discussed above, this particular embodiment of the invention requires the same number of transistors in the transmission unit as the prior art required. Consequently, and unlike programmable logic structure 200 discussed above, programmable logic structure 200B does not represent a significant savings over the prior art in terms of components required or silicon used. However, According to the invention, logic blocks 251 and 253 are comprised of low threshold transistors. Consequently, programmable logic structure 200B can be provided with a very low supply voltage. Therefore pass transistors 257 and 259 can be overdriven on using relatively standard voltages, such as 2.0 volts, and consequently pass transistors 257 and 259 can be overdriven on without fear of harming pass transistors 257 and 259. For instance, in one embodiment of the invention, programmable logic structure 200B's first supply voltage 281 is 200 millivolts while the magnitude of $V_{gs}$ of pass transistors 257 and 259 is made on the order of 2.0 volts by providing a separate supply voltage to gate 257G of around 2.0 volts and a separate supply voltage to gate 259G of around −2.0 volts. This is in direct contrast to prior art transmission gates that had to be driven at essentially the same $V_{gs}$ as the supply voltage to avoid transistor breakdown. As discussed in more detail above, by overdriving pass transistors 257 and 259 of the invention, the resistance added to the programmable logic structure 200B by pass transistors 257 and 259, i.e., the resistance added by coupling pass transistors 257 and 259 between first and second logic blocks 251 and 253, is decreased significantly without resorting to increasing the size of pass transistors 257 and 259.

In addition, as discussed above, either or both of pass transistors 257 and 259 can be low threshold pass transistors with unbiased threshold voltages with a magnitude of less than 300 millivolts. In this embodiment, the resistance added by transmission gate 255 is further reduced. In this embodiment of the invention, in addition to overdriving pass transistors 257 and 259 on, it is also desirable to overdrive the low threshold pass transistors off to reduce leakage current and further isolate logic blocks 251 and 253.

Figure 3:
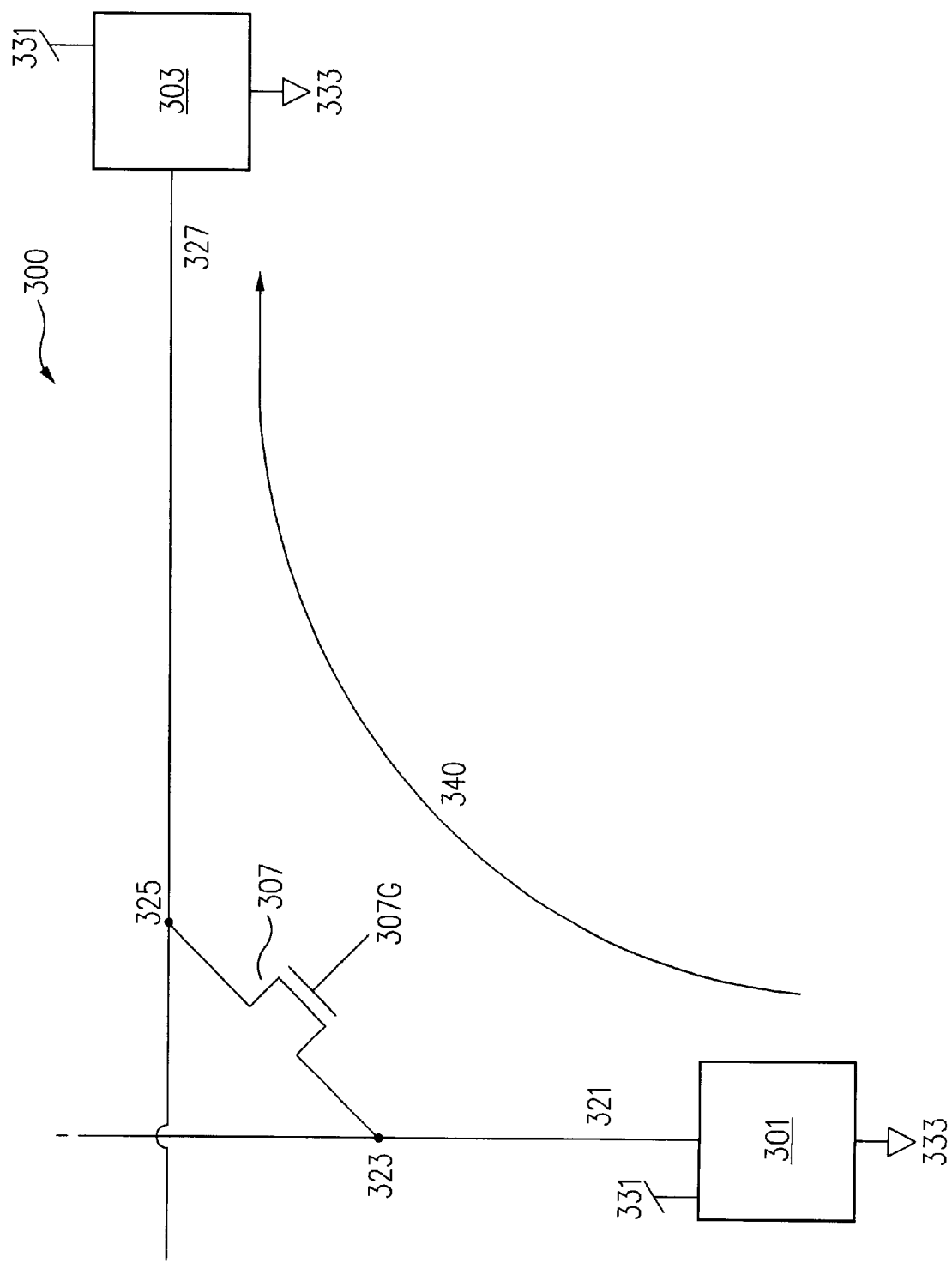
FIG. 3 shows the structure and method of the present invention being used in a programmable path structure in accordance with the principles of one embodiment of the invention.

As discussed above, the method and structure of the present invention is particularly well suited to programmable interconnect structures such as FPGAs, programmable interconnect logic and circuits, and pre-set fast path structures. FIG. 3 shows the structure and method of the present invention being used in a programmable path structure 300. As shown in FIG. 3, in this embodiment of the invention, pass transistor 307 is coupled between point 323 on line 321 and point 325 on line 327. In this embodiment of the invention, pass transistor 307 is overdriven on by a voltage (not shown) applied to gate 307G that is greater that the supply voltage 331 supplied to programmable path structure 300, i.e., to low voltage logic blocks 301 and 303. In this embodiment of the invention, when pass transistor 307 is overdriven on, a path 340 joining low voltage logic blocks 301 and 303 is created.

Figure 4:
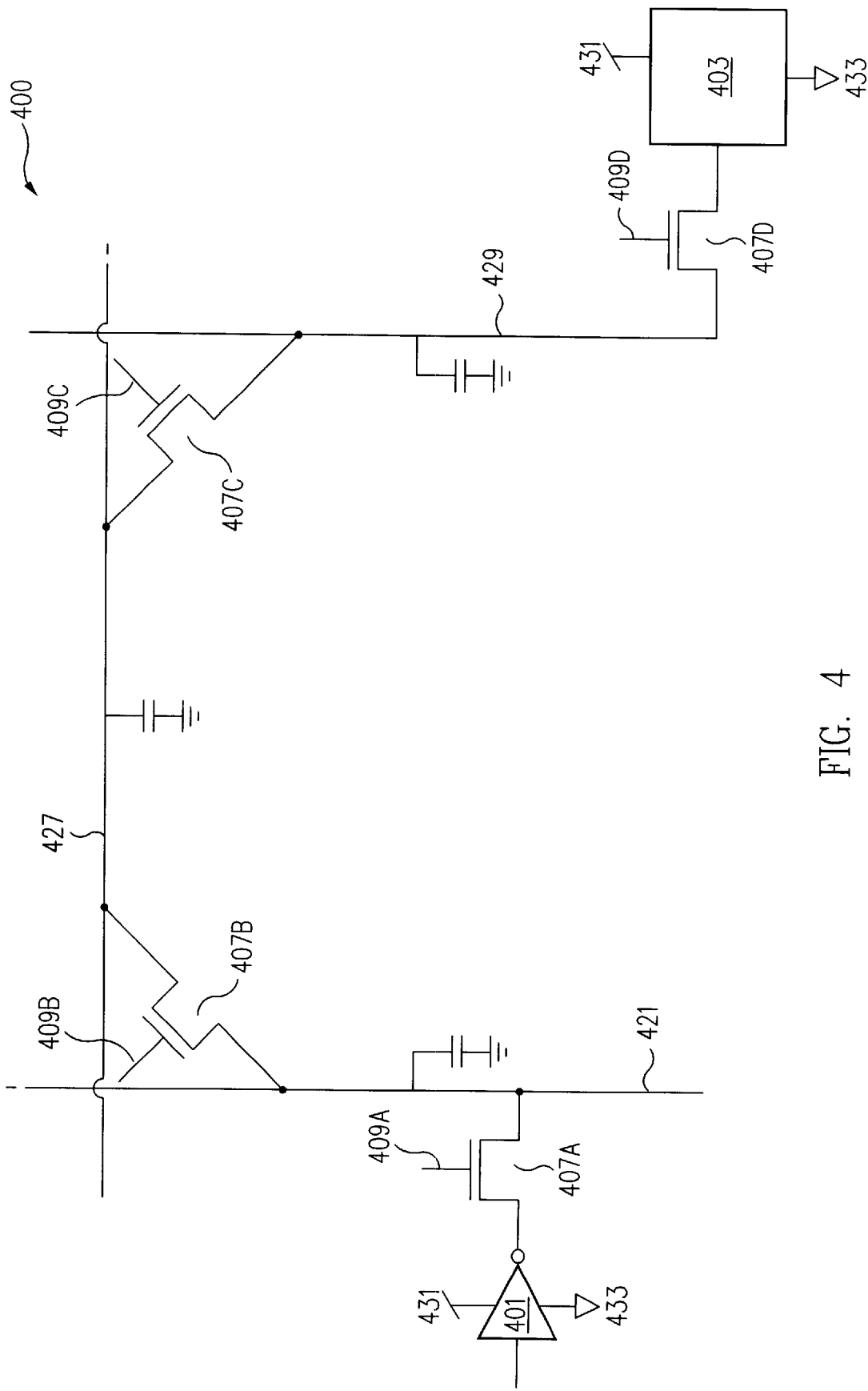
FIG. 4 shows the structure and method of the present invention being used in a more complex programmable path structure in accordance with the principles of one embodiment of the invention.

While only two lines, 321 and 327, are shown in FIG. 3, connected by a single pass transistor 307, most programmable path structures using the invention will involve multiple pass transistors 307 between logic blocks 301 and 303. FIG. 4 shows a more complex programmable path structure 400 including: low voltage driver logic 401; first pass transistor 407A; second pass transistor 407B; third pass transistor 407C; fourth pass transistor 407D; and low voltage logic block 403.

As noted, according to the invention, driver 401 is a low voltage driver comprised of low threshold transistors with unbiased threshold voltages of less than 300 millivolts. In addition, like logic blocks 201 and 203 (FIG. 2), discussed above, low voltage logic block 403 (FIG. 4) typically comprises any one of numerous devices well known to those of skill in the art such as a single transistor, inverter, latch, any one of several gates, or any other logic or memory devices. According to the invention, regardless of the particular types of devices included in logic block 403, the device in logic block 403 is a low voltage device comprised of low threshold transistors (not shown) with unbiased threshold voltages of less than 300 millivolts.

For a detailed discussion of low voltage and low threshold transistors and devices, see the list of related Patents below, all issued in the name of the present inventor and assigned to assignee of the present invention, that are incorporated herein, in their entirety, by reference.

Low voltage driver 401 and logic block 403 each include first supply voltage 431 and second supply voltage 433. Since, according to the invention, low voltage driver 401 and logic block 403 are comprised of low threshold transistors, low voltage driver 401 and logic block 403 are provided with very low supply voltages, typically less than 400 millivolts and, in one embodiment, the supply voltage is 200 millivolts. Consequently, in one embodiment of the invention, first supply voltage 431 is typically 200 millivolts and second supply voltage 433 is ground.

As seen in FIG. 4, according to the invention, programmable path structure 400 also includes first pass transistor 407A; second pass transistor 407B; third pass transistor 407C; and fourth pass transistor 407D for selectively, and programmably, connecting low voltage driver 401 and low voltage logic block 403. According to the invention, first pass transistor 407A; second pass transistor 407B; third pass transistor 407C; and fourth pass transistor 407D are all capable of, and are meant to be, overdriven by a separate supply voltage provided to the respective gates 409A, 409B, 409C and 409D of first pass transistor 407A; second pass transistor 407B; third pass transistor 407C; and fourth pass transistor 407D, respectively.

When, according to the invention, first pass transistor 407A, is overdriven on, first pass transistor 407A selectively connects low voltage driver 401 to line 421. When, according to the invention, second pass transistor 407B, is overdriven on, second pass transistor 407B selectively connects line 421 to line 427. When, according to the invention, third pass transistor 407C, is overdriven on, third pass transistor 407C selectively connects line 427 to line 429. When, according to the invention, fourth pass transistor 407D, is overdriven on, fourth pass transistor 407D selectively connects line 429 to low voltage logic block 403. Consequently, by selectively overdriving first pass transistor 407A; second pass transistor 407B; third pass transistor 407C; and fourth pass transistor 407D on, a path 440 is selectively established between low voltage driver 401 and logic block 403.

As can be readily determined by examining FIG. 4, and by the discussion above, four transistors: first pass transistor 407A; second pass transistor 407B; third pass transistor 407C; and fourth pass transistor 407D lie along path 440. Consequently, as discussed above, using the method and structure of one embodiment the invention, instead of the prior art structures discussed above, four less transistors are used and one-tenth the resistance is added. Since most programmable path structures are far more complicated than programmable path structure 400, and most include literally thousands, if not millions, of potential connections such as those shown in FIG. 3 and FIG. 4, the savings in terms of fewer transistors used, less resistance added, and less added parasitic capacitance using the method and structure of the invention, is indeed significant.

In addition, as discussed above, any of pass transistors 407A, 407B, 407C, and 407D can be low threshold pass transistors with unbiased threshold voltages having a magnitude of less than 300 millivolts. In this embodiment, the resistance added by pass transistors 407A, 407B, 407C, and 407D is further reduced. In this embodiment of the invention, in addition to overdriving pass transistors pass transistors 407A, 407B, 407C, and 407D on, it is also desirable to overdrive the low threshold pass transistors off to reduce leakage current and further isolate components, such as logic block 403 and low voltage driver 431.

As discussed above, prior art transmission gate 105 had three significant drawbacks. First, the addition of prior art transmission gate 105 added significant resistance to the path between output node 113 of prior art logic block 101 and input node 119 of prior art logic block 103. Second, prior art transmission gate 105 was a relatively complex structure requiring the use of at least two transistors, 107 and 109. Third, prior art transmission gate 105 added significant parasitic capacitance to the path between output node 113 of prior art logic block 101 and input node 119 of prior art logic block 103. This added resistance and parasitic capacitance meant decreased performance of prior art structure 100 and increased power dissipation.

As also discussed above, all three of these drawbacks of prior art transmission gate 105 are overcome, or reduced, by using the method and structure of the present invention including a single overdriven pass transistor and by providing low voltage logic.

In particular, programmable logic structures of the invention include low voltage logic blocks comprising low threshold transistors and therefore programmable logic structures of the invention can operate at very low supply voltages. Consequently, pass transistors of the invention can, and are, overdriven on. By overdriving pass transistors of the invention on, the resistance added by the pass transistors is significantly reduced.

In addition, since the pass transistors of the invention are overdriven on, the pass transistors pass both digital ones and digital zeros efficiently. Consequently, a single pass transistor can be used. By using a single pass transistor, the structure is simplified, the parasitic capacitance is reduced, and the number of transmission transistors used with the invention is typically half the number used in prior art structures. In addition, according to the invention, the pass transistors can be low threshold pass transistors. In this embodiment, resistance is further reduced and the ability to pass digital ones and digital zeros is further enhanced. In this event, it is desirable to overdrive the low threshold pass transistors of the invention off as well to control leakage current and more effectively isolate the logic blocks.

This Application is related to: U.S. Pat. No. 5,773,863 entitled "Low Power, High Performance Junction Transistor"; U.S. Pat. No. 5,780,912 entitled "Asymmetric Low Power MOS Devices "; U.S. Pat. No. 5,622,880 entitled "Method of Making a Low Power, High Performance Junction Transistor"; U.S. Pat. No. 5,753,958 entitled "Back-Biasing in Asymmetric MOS Devices"; U.S. Pat. No. 5,650,340 entitled "Method for Making Asymmetric Low Power Devices"; U.S. Pat. No. 5,719,422, entitled "Low Threshold Voltage, High Performance Junction Transistor"; U.S. Pat. No. 6,137,142 entitled "MOS Device Structure and Method for Reducing PN Junction Leakage"; U.S. Pat. No. 6,110,783 entitled "Method for Forming a Notched Gate Oxide Asymmetric MOS Device"; U.S. Pat. No. 6,121,666 entitled "Split Gate Oxide Asymmetric MOS Device"; U.S. Pat. No. 6,093,951 entitled "MOS Devices With Retrograde Pocket Regions"; U.S. Pat. No. 5,985,727 entitled "Method for Forming MOS Devices with Retrograde Pocket Regions and Counter Dopant Regions Buried in the Substrate Surface"; U.S. Pat. No. 5,923,987 entitled "Method for Forming MOS Devices with Retrograde Pocket Regions and Counter Dopant Regions Buried in the Substrate Surface"; U.S. Pat. No. 5,942,781 entitled "Tunable Threshold SOI Device Using Back Gate Well"; U.S. Pat. No. 6,100,567 entitled "Tunable Threshold SOI Device Using Back Gate and Intrinsic Channel Region"; U.S. Pat. No. 6,072,217 entitled "Tunable Threshold Device Using Isolated Well Structure for Back Gate"; U.S. Pat. No. 6,048,746 entitled "Methods for Making Die-Compensated Threshold Tuning Circuit"; U.S. Pat. No. 6,087,892 entitled "Target Ion/Ioff Threshold Tuning Circuit and Method"; U.S. Pat. No. 5,998,850 entitled "Tunable Field Plate"; U.S. Pat. No. 6,091,283 entitled "Sub-Threshold Leakage Tuning Circuit"; U.S. Pat. No. 5,471,421 entitled "Storage Cell Using Low Powered/Low Threshold CMOS Pass Transistors Having Reduced Charge Leakage"; U.S. Pat. No. 5,581,500 entitled "Memory Cell with Power Supply Induced Reversed-Bias Pass Transistors for Reducing Off-Leakage Current"; U.S. Pat. No. 5,566,120 entitled "Apparatus and Method for Controlling Transistor Current Leakage"; U.S. Pat. No. 6,606,270 entitled "Dynamic Clocked Inverter Latch with Reduced Charge Leakage"; U.S. Pat. No. 5,612,645 entitled "Dynamic MOSFET Threshold Voltage Controller"; U.S. Pat. No. 5,640,115 entitled "Self-Enabling Latch"; and U.S. patent application No. 09/030,030, now allowed, entitled "Back biased MOS Device and Method" all of which are assigned to the assignee of the present invention and are incorporated herein, in their entirety, by reference for all purposes.

The foregoing description of an implementation of the invention has been presented for purposes of illustration and description, and therefore is not exhaustive and does not limit the invention to the precise form disclosed. Modifications and variations are possible in light of the above teachings or may be acquired from practicing the invention. Consequently, the scope of the invention is defined by the claims and their equivalents.

What is claimed is:

1. A structure comprising:
   a first logic block, said first logic block comprising a first low voltage device comprised of low threshold transistors;
   a second logic block, said second logic block comprising a second low voltage device comprised of low threshold transistors;
   a first supply voltage supplied to said first and second logic blocks;
   a second supply voltage supplied to said first and second logic blocks;
   a pass transistor coupled between said first logic block and said second logic block; and
   a third supply voltage supplied to a gate of said pass transistor to overdrive said pass transistor, wherein;
      a voltage differential between said first supply voltage and said second supply voltage is less than about 400 millivolts.

2. The structure of claim 1, wherein;
   said low threshold transistors comprising said first and second devices have an unbiased threshold voltage with a magnitude of less than 300 millivolts.

3. The structure of claim 1, wherein;
   said pass transistor is a low threshold pass transistor.

4. The structure of claim 3, wherein;
   said pass transistor is a low threshold pass transistor having an unbiased threshold voltage with a magnitude of less than 300 millivolts.

5. The structure of claim 1, wherein:
   said third supply voltage has a magnitude less than 2.0 volts when said pass transistor is overdriven on.

6. The structure of claim 3, wherein:
   said third supply voltage has a magnitude less than 500 millivolts when said low threshold pass transistor is overdriven off.

7. The structure of claim 1, wherein:
   said structure is part of an FPGA.

8. A structure comprising:
   a first logic block, said first logic block comprising a first low voltage device comprised of low threshold transistors;
   a second logic block, said second logic block comprising a second low voltage device comprised of low threshold transistors, wherein;
      said low threshold transistors comprising said first and second devices have an unbiased threshold voltage with a magnitude of less than 300 millivolts;

a first supply voltage supplied to said first and second logic blocks;

a second supply voltage supplied to said first and second logic blocks, wherein;
 a voltage differential between said first supply voltage and said second supply voltage is less than about 400 millivolts;

a pass transistor coupled between said first logic block and said second logic block; and a third supply voltage supplied to a gate of said pass transistor to overdrive said pass transistor, wherein;
 said third supply voltage has a magnitude of less than 2.0 volts when said pass transistor is overdriven on.

9. A structure comprising:

a first logic block, said first logic block comprising a first low voltage device comprised of low threshold transistors;

a second logic block, said second logic block comprising a second low voltage device comprised of low threshold transistors, wherein;
 said low threshold transistors comprising said first and second devices have an unbiased threshold voltage with a magnitude of less than 300 millivolts;

a first supply voltage supplied to said first and second logic blocks;

a second supply voltage supplied to said first and second logic blocks, wherein;
 a voltage differential between said first supply voltage and said second supply voltage is less than about 400 millivolts;

a low threshold pass transistor coupled between said first logic block and said second logic block; and a third supply voltage supplied to a gate of said pass transistor to overdrive said pass transistor, wherein;
 said third supply voltage has a magnitude of less than 2.0 volts when said low threshold pass transistor is overdriven on, and further wherein:
 said third supply voltage a magnitude of less than 500 millivolts volts when said low threshold pass transistor is overdriven off.

10. A structure comprising:

a first logic block, said first logic block comprising a first low voltage device comprised of low threshold transistors;

a second logic block, said second logic block comprising a second low voltage device comprised of low threshold transistors;

a first supply voltage supplied to said first and second logic blocks;

a second supply voltage supplied to said first and second logic blocks;

a transmission unit, said transmission unit comprising:
 an NFET pass transistor coupled between said first logic block and said second logic block; and
 a PFET pass transistor coupled between said first logic block and said second logic block, in parallel with said NFET pass transistor;

a third supply voltage supplied to a gate of said NFET pass transistor to overdrive said NFET pass transistor; and a fourth supply voltage supplied to a gate of said PFET pass transistor to overdrive said PFET pass transistor, wherein;

a voltage differential between said first supply voltage and said second supply voltage is less than about 400 millivolts.

11. The structure of claim 10, wherein;
said low threshold transistors comprising said first and second devices have an unbiased threshold voltage with a magnitude of less than 300 millivolts.

12. The structure of claim 10, wherein;
at least one of said pass transistors is a low threshold pass transistor.

13. The structure of claim 10, wherein;
at least one of said pass transistors is a low threshold pass transistor with an unbiased threshold voltage with a magnitude of less than 300 millivolts.

14. The structure of claim 10, wherein:
said third supply voltage is less than 2.0 volts when said NFET pass transistor is overdriven on.

15. The structure of claim 12, wherein:
said NFET pass transistor is a low threshold pass transistor and said third supply voltage is greater than −500 millivolts when said NFET pass transistor is overdriven off.

16. The structure of claim 10, wherein:
said fourth supply voltage is greater than −2.0 volts when said PFET pass transistor is overdriven on.

17. The structure of claim 12, wherein:
PFET pass transistor is a low threshold pass transistor and said fourth supply voltage is less than 500 millivolts when said PFET pass transistor is overdriven off.

18. The structure of claim 10, wherein:
said structure is part of an FPGA.

19. A structure comprising:

a first logic block, said first logic block comprising a first low voltage device comprised of low threshold transistors;

a second logic block, said second logic block comprising a second low voltage device comprised of low threshold transistors, wherein;
 said low threshold transistors comprising said first and second devices have an unbiased threshold voltage with a magnitude of less than 300 millivolts;

a first supply voltage supplied to said first and second logic blocks;

a second supply voltage supplied to said first and second logic blocks, wherein;
 a voltage differential between said first supply voltage and said second supply voltage is less than about 400 millivolts;

a transmission unit, said transmission unit comprising:
 an NFET pass transistor coupled between said first logic block and said second logic block; and said NFET pass transistor;
 a PFET pass transistor coupled between said first logic block and said second logic block, in parallel with a third supply voltage supplied to a gate of said NFET pass transistor to overdrive said NFET pass transistor, wherein;
 said third supply voltage is less than 2.0 volts when said NFET pass transistor is overdriven on; and a fourth supply voltage supplied to a gate of said PFET pass transistor to overdrive said PFET pass transistor, wherein;
 said fourth supply voltage is greater than −2.0 volts when said PFET pass transistor is overdriven on.

20. The structure of claim 9, wherein:
said structure is part of an FPGA.

21. A structure comprising:
   a first logic block, said first logic block comprising a first low voltage device comprised of low threshold transistors;
   a second logic block, said second logic block comprising a second low voltage device comprised of low threshold transistors, wherein;
      said low threshold transistors comprising said first and second devices have an unbiased threshold voltage with a magnitude of less than 300 millivolts;
   a first supply voltage supplied to said first and second logic blocks;
   a second supply voltage supplied to said first and second logic blocks, wherein;
      a voltage differential between said first supply voltage and said second supply voltage is less than about 400 millivolts;
   a transmission unit, said transmission unit comprising:
      a low threshold NFET pass transistor coupled between said first logic block and said second logic block; and
      a low threshold PFET pass transistor coupled between said first logic block and said second logic block, in parallel with said low threshold NFET pass transistor;
   a third supply voltage supplied to a gate of said low threshold NFET pass transistor to overdrive said low threshold NFET pass transistor, wherein;
      said third supply voltage is less than 2.0 volts when said low threshold NFET pass transistor is overdriven on, further wherein;
      said third supply voltage is greater than −500 millivolts when said low threshold NFET pass transistor is overdriven off; and
   a fourth supply voltage supplied to a gate of said low threshold PFET pass transistor to overdrive said low threshold PFET pass transistor, wherein;
      said fourth supply voltage is greater than −2.0 volts when said low threshold PFET pass transistor is overdriven on, further wherein;
      said fourth supply voltage is less than 500 millivolts when said low threshold PFET pass transistor is overdriven off.

* * * * *